(12) United States Patent
Castle et al.

(10) Patent No.: US 6,991,945 B1
(45) Date of Patent: Jan. 31, 2006

(54) FAULT DETECTION SPANNING MULTIPLE PROCESSES

(75) Inventors: Howard E. Castle, Austin, TX (US); Matthew A. Purdy, Austin, TX (US); Gregory A. Cherry, Austin, TX (US); Richard J. Markle, Austin, TX (US); Eric O. Green, Austin, TX (US); Michael L. Miller, Cedar Park, TX (US); Brian K. Cusson, Austin, TX (US)

(73) Assignee: Advanced Micro Devices, Inc., Austin, TX (US)

(*) Notice: Subject to any disclaimer, the term of this patent is extended or adjusted under 35 U.S.C. 154(b) by 104 days.

(21) Appl. No.: 10/231,911

(22) Filed: Aug. 30, 2002

(51) Int. Cl.
H01L 21/66 (2006.01)

(52) U.S. Cl. .......................................... 438/14

(58) Field of Classification Search .................... 438/14
See application file for complete search history.

(56) References Cited

U.S. PATENT DOCUMENTS 6,303,395 B1 * 10/2001 Nulman ....................... 438/14

* cited by examiner

Primary Examiner—Ha Nguyen
Assistant Examiner—Andre' C. Stevenson
(74) Attorney, Agent, or Firm—Williams, Morgan & Amerson, P.C.

(57) ABSTRACT

A method and apparatus is provided for fault detection spanning multiple processes. The method comprises receiving operational data associated with a first process, receiving operational data associated with a second process, which is downstream to the first process and performing fault detection analysis based on the operational data associated with the first process and second process using a common fault detection unit.

21 Claims, 3 Drawing Sheets

FAULT DETECTION SPANNING MULTIPLE PROCESSES

BACKGROUND OF THE INVENTION

1. Field of the Invention

This invention relates generally to a semiconductor fabrication process, and, more particularly, to detecting faults across multiple semiconductor processes.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in continual improvements in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

During the fabrication process, various events may take place that affect the performance of the devices being fabricated. That is, variations in the fabrication process steps may result in device performance variations. Factors, such as feature critical dimensions, doping levels, contact resistance, particle contamination, etc., all may potentially affect the end performance of the device. Various tools in the processing line are controlled, in accordance with performance models, to reduce processing variation. Commonly controlled tools include photolithography steppers, polishing tools, etching tools, and deposition tools. Pre-processing and/or post-processing metrology data is supplied to process controllers for the tools. Operating recipe parameters, such as processing time, are calculated by the process controllers based on the performance model and the metrology information to attempt to achieve post-processing results as close to a target value as possible. Reducing variation in this manner leads to increased throughput, reduced cost, higher device performance, etc., all of which equate to increased profitability.

Semiconductor manufacturing processes, which have become more reliable and robust over the past few years, may include a plurality of processing tools that cooperate with each other to process semiconductor devices, such as microprocessors, memory devices, ASICs, etc. To verify that the processing tools are operating within acceptable parameters, it has become increasingly desirable to monitor the operating conditions of such processing tools.

Today's semiconductor manufacturing processes may include an intricate network of multiple processing tools for manufacturing semiconductor devices. Linking multiple processing tools may provide numerous advantages in the manufacture of semiconductor devices, but there can, however, be some drawbacks, particularly from the standpoint of troubleshooting problems or faults. For example, assume that two processing tools are "linked" due to their interdependency on each other to provide a desired result. If results or performance from the upstream processing tool are not predictable or on target, the wafer resulting from a downstream process can be unacceptable even though the downstream tool performed as expected. A fab technician may expend considerable time analyzing the downstream processing tool even though the actual cause of the fault lies with the upstream tool. Not surprisingly, when more than two separate processes are "linked," trouble shooting problems can become even more challenging. Failure to identify, in a timely manner, the source of the detected faults may naturally delay any potentially corrective measures that can be taken to address the problem. Because of these delays, the operation of the semiconductor manufacturing process may be adversely affected, thereby resulting in a potential increase in costs for the manufacturer and consumer.

The present invention is directed to overcoming, or at least reducing the effects of, one or more of the problems set forth above.

SUMMARY OF THE INVENTION

In one embodiment of the present invention, a method is provided for fault detection spanning multiple processes. The method comprises receiving operational data associated with a first process, receiving operational data associated with a second process, which is downstream to the first process and performing fault detection analysis based on the operational data associated with the first process and second process using a common fault detection unit.

In another embodiment of the present invention, a fault detection and classification unit is provided for fault detection spanning multiple processes. The fault detection and classification unit comprises an interface and a control unit, which is communicatively coupled to the interface. The interface is adapted to receive fault data from a first fault detection unit that is associated with a first processing tool and receive fault data from a second fault detection unit that is associated with a second processing tool. The second processing tool is downstream relative to the first processing tool. The control unit is adapted to determine if a fault associated with the first processing tool occurred based on the fault data from the first fault detection unit and determine if a fault associated with the second processing tool occurred based on the fault data from the second fault detection unit and determine if the second processing tool is operating as desired in response to determining that a fault associated with the second processing tool occurred but no fault associated with the first processing tool occurred.

In a further embodiment of the present invention, an article comprising one or more machine-readable storage media containing instructions is provided for fault detection spanning multiple processes. The one or more instructions, when executed, enable a processor to receive operational data associated with a first process, receive operational data associated with a second process, which is downstream to the first process and perform fault detection analysis based on the operational data associated with the first process and second process using a common fault detection unit.

In yet a further embodiment of the present invention, a system is provided for fault detection spanning multiple processes. The system comprises a first processing tool, a second processing tool and a fault detection and classification unit. The first processing tool is adapted to process a semiconductor device. The second processing tool is adapted to process a semiconductor device. The second processing tool is downstream to the first processing tool. The fault detection and classification unit is adapted to receive operational data from the first processing tool, receive operational data from a second fault detection unit that is associated with a second processing tool, which is downstream relative to the first processing tool and determine if a fault associated with the first processing tool occurred based on the operational data from the first fault detection unit and determine if a fault associated with the second processing tool occurred based on the operational data from the second fault detection unit. The system further determines if the second processing tool is operating as desired in response to determining that a fault associated with the second processing tool occurred but no fault associated with the first processing tool occurred.

BRIEF DESCRIPTION OF THE DRAWINGS

The invention may be understood by reference to the following description taken in conjunction with the accompanying drawings, in which like reference numerals identify like elements, and in which.

Figure 1:
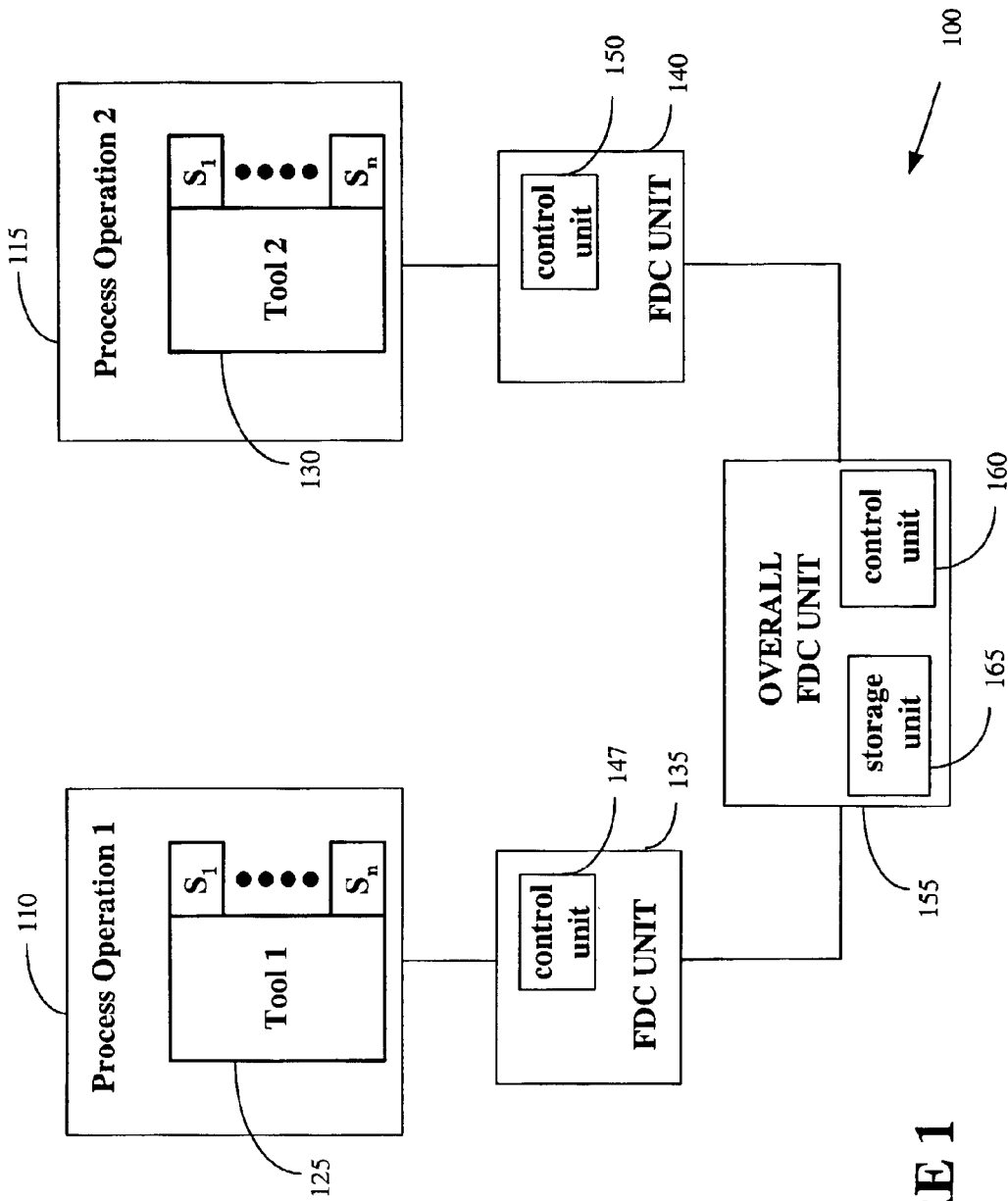
FIG. 1 illustrates a manufacturing system including a fault detection and classification unit spanning more than one process operation, in accordance with one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Turning now to the drawings, and specifically referring to FIG. 1, a block diagram of a manufacturing system 100 for providing fault detection and analysis in a semiconductor fabrication process is illustrated, in accordance with one embodiment of the present invention. The system 100 includes at least two process operations 110, 115, each including at least respective processing tools 125, 130. The process operations 110, 115, in the illustrated embodiment, are separate and distinct process operations that are "linked" by way of their interdependency on each other to process the same workpieces, although not necessarily simultaneously, to achieve a desired result. An example of the two process operations 110, 115 is described below.

The second process operation 115 is downstream to the first process operation 110, in the illustrated embodiment. The term "downstream," as utilized herein, refers to the relative processing order of the two processing flows 110, 115, without regard to temporal and spatial separation of the two process operations 110, 115. Thus, even though the second process operation 115 is downstream to the first process operation 110, the second process operation 115 may be located in an entirely different room as the first process operation 110. Moreover, the second process operation 115 may occur immediately following the first process operation 110, or it may occur a few minutes to several days after the first process operation 10, depending on the particular implementation.

The first process operation 110 and the second process operation 115, for example, may include any two of the process steps of a "single damascene" process that is commonly used to form conductive interconnections of copper. In particular, the first and second process operations 110, 115 may involve a combination of any two of the following steps: forming a layer of insulating material on or above a semiconducting substrate; forming a plurality of openings in the layer of insulating material; depositing a relatively thin barrier metal layer comprised of, for example, tantalum, is conformally deposited above the insulating layer and in the openings in the insulating layer; depositing a relatively thin layer of copper, a so-called copper seed layer, on the barrier metal layer, forming a much thicker layer of copper that fills the remaining portions of the openings in the insulating layer and has an upper surface that extends above the surface of the insulating layer; and performing one or more chemical mechanical polishing (CMP) operations to remove the excess copper and barrier layer material from above the surface of the insulating layer. This process may be used to define a plurality of conductive interconnections, e.g., conductive lines or plugs, or a combination of both, positioned within the openings in the insulating layer.

The example provided above is illustrative in nature and shows two separate process operations 110, 115 that are interdependent on each other in that the second process operation 115 relies on the first process operation 110 to provide an acceptable wafer. That is, the second process operation 115, even though it is operating as desired, may not be able to provide acceptable results if it is provided even marginally defective wafers by the first process operation 110. As described below, in one embodiment, a fault detection and classification technique is provided that spans multiple processes or process operations 110, 115 to aid in identifying the actual faulty process when a fault is detected.

The processing tools 125, 130 of the process operations 110, 115 may be in the form of semiconductor fabrication equipment used to produce and process semiconductor material, such as silicon wafers, for example. The processing tools 125, 130 of the manufacturing system 100, in one embodiment, may each perform various processing steps to create a packaged semiconductor device. For example, the processing tools 125, 130 may be used for manufacturing the raw semiconductor material, slicing the semiconductor crystal ingot into individual wafers, fabricating (e.g., etching, doping, ion implanting) the wafers, testing and packaging the completed semiconductor devices. It will be appreciated, however, that the processing tools 125, 130 need not necessarily be limited to the production of silicon wafers, but could include other types of manufacturing equipment for producing a variety of different types of commercial products without departing from the spirit and scope of the present invention. In one embodiment, the processing tools 125, 130 may each have multi-chambers for performing a selected process.

A plurality of sensors $S_1 \ldots S_n$ (where "n" may go to infinity) is operatively coupled to each of the respective processing tools 125, 130 for obtaining data regarding the processing operations performed by the processing tools 125, 130. In one embodiment, the sensors $S_1 \ldots S_n$ may measure data that is associated with the processing tool 125, 130. For example, the sensors $S_1 \ldots S_n$ may be used to determine a temperature range or other ambient data near or around the associated processing tool 125, 130. The type of data collected from the processing tool 125, 130 may in part depend on the type of processing tool that is employed. For example, exemplary tool state data for a copper polishing tool may include polish time, downforce, polishing pad speed, motor current, polishing arm oscillation magnitude and frequency, slurry chemical composition, temperature inside the tool, etc. Similarly, the sensors $S_1 \ldots S_n$ may measure other parameters and, thus, need not be limited to the aforementioned examples. The data provided by the sensors $S_1 \ldots S_n$, as well as any other data provided with respect to the operation or processing of the processing tool 125, 130, is hereinafter referred to as "operational data."

The sensors $S_1 \ldots S_n$ may be embodied as a simple data acquisition program, such as a C++ standalone program acquiring data from a thermocouple wire, for example. Alternatively, the sensors $S_1 \ldots S_n$ may be embodied as a full-fledged LABVIEW application, acquiring data through multiple transducers (not shown). The number of sensors $S_1 \ldots S_n$ associated with the processing tools 125, 130 may vary based on the particular implementation.

In the illustrated embodiment of FIG. 1, each process operation 110, 115 has its own respective fault detection and classification (FDC) unit 135, 140. The FDC units 135, 140 may include a respective control unit 147, 150 and a storage unit (not shown). In the illustrated embodiment, each FDC unit 135, 140 detects and classifies one or more faults associated with its respective process operation 110, 115. Each FDC unit 135, 140, in one embodiment, compares the received operational data from its respective processing tools 125, 130 of the process operations 110, 115 to fault model data. The fault model data includes operational data of other similar-type tools, where it was previously known that such tools have operated within acceptable operational limits. The types of faults that may be detected by the FDC units 135, 140 include processing and/or operational faults in silicon wafer fabrication. Examples of processing faults may include, but are not necessarily limited to, non-optimal preheating of the chamber, catastrophic failure where a broken wafer is detected, abnormal nitrogen (N2) flow rate, temperature overshoots at the top of a ramp, tube temperature measurement drifts, etc. Examples of operational faults detected may include interrupted/resumed processing, no wafer sleuth or improper wafer sleuth prior to Rapid Thermal Anneal (RTA), etc. In the illustrated embodiment, the two fault detection and classification units 135, 140 are independent and thus do not have access to each other's data.

The FDC units 135, 140 may include a commercially available software package, such as ModelWare, for example, that provides fault detection analysis of the processing tools 125, 130. It will be appreciated, however, that other types of commercially available fault detection software may also be used in lieu thereof without departing from the spirit and scope of the present invention.

In one embodiment, the processing tools 125, 130 may interface with their respective FDC units 135, 140 through a respective equipment interface (not shown) and an Advanced Process Control (not shown) framework. An exemplary Advanced Process Control may be implemented using the Catalyst system offered by KLA-Tencor, Inc. The Catalyst system uses Semiconductor Equipment and Materials International (SEMI) Computer Integrated Manufacturing (CIM) Framework compliant system technologies and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI, which is headquartered in Mountain View, Ca.

During the manufacturing process, errors or faults may occur at a variety of points and for a variety of reasons. The term "fault," as utilized herein, refers to any undesirable condition that occurs in association with the operation or processing of the processing tools 125, 130 of the process operations 110, 115. One example of a fault may be an alarm that is generated by the processing tools 125, 130 when unexpected or undesired events, such as an overheating chamber, load lock error, and the like, occur in that processing tool 125, 130. Another example of a fault includes detecting a defectively processed semiconductor device in the manufacturing system 100, which, for example, may be a wafer that is manufactured outside the acceptable parameters or not within the prescribed operational parameters.

Faults can occur because of a malfunction in the processing tool 125, 130 itself. As such, because of the malfunction in the processing tool 125, 130, the processing tool 125, 130 may produce one or more defective semiconductor devices or generate an alarm indicating an undesirable condition. However, faults can also occur for reasons that are substantially independent of the processing tool 125, 130. That is, while the processing tool 125, 130 may generate the fault, the actual source of the fault may be an event or act that is independent of the processing tool 125, 130. For example, if the first processing tool 125 provides a marginally defective or a defective wafer that may not have been detected by the first FDC unit 135) to the second the processing tool 130, the second processing tool 130, even though it is operating correctly, may nevertheless produce a fault because it was unable to provide an acceptable wafer result based on the defective wafer that was provided by the first processing tool 125. Embodiments of the present invention identify the possible causes of faults that are not necessarily caused by the processing tool 125, 130 that report the fault.

In accordance with one embodiment of the present invention, the manufacturing system 100 includes an overall fault detection and classification (FDC) unit 155 having a control unit 160 and a storage unit 165. In one embodiment, the storage unit 165 may be located outside the FDC unit 155 where various components of the manufacturing system 100 may access the contents of the storage unit 165. The overall fault detection and analysis unit interfaces with the FDC units 135, 140 associated with the process operations 110, 115. Based on input signals from the FDC units 135, 140, the overall FDC unit 155 can monitor the overall health of the process operations 110, 115 and take appropriate actions if wafer results are not on target. As noted, because the FDC units 135, 140 do not have access to each other's data, the FDC units 135, 140 are not able to share data and perform cross-process operation fault detection analysis. The overall FDC unit 155, as described below, bridges this disconnect between the two FDC units 135, 140.

Figure 2:
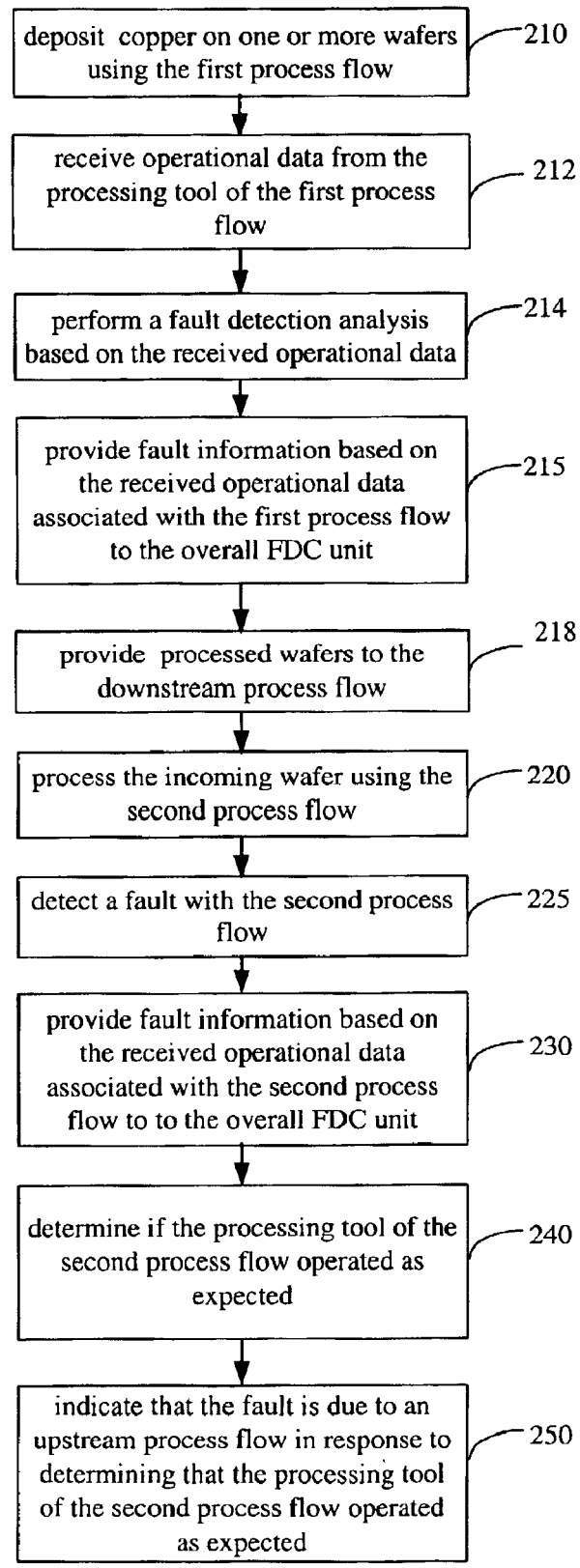
FIG. 2 depicts a flow diagram of a method that may be implemented in the manufacturing system of FIG. 1, in accordance with one embodiment of the present invention.

An exemplary scenario in which the overall FDC unit 155 may be useful in detecting and classifying faults is described in the context of a method of FIG. 2. For illustrative purposes it is assumed that the first process operation 110 comprises depositing copper on wafers and the second process operation 115 comprises polishing the wafers provided from the first process operation 110. The method of FIG. 2 begins with the first process operation 110 that deposits (at 210) copper on one or more wafers. For the purposes of this illustration, it is assumed that the first process operation 110 produces at least some marginally defective or defective wafers. The FDC unit 135 receives (at 212) operational data from the processing tool 125 of the first process operation 110, and then performs (at 214) a fault detection analysis based on the received operational data.

For the purposes of the illustration, it is herein assumed that the FDC unit 135 does not detect a fault based on the received operational data, either because the marginally defective wafer was barely within an acceptable range or because the FDC unit 135 altogether failed to detect the misprocessed wafer. The FDC unit 135 provides (at 215) fault information based on at least a portion of the operational data associated with the first process operation 110 (e.g., the first processing tool 125) to the overall FDC unit 155. In another embodiment, the operational data itself may be provided to the overall FDC unit 155.

The wafers processed by the first process operation 110 are provided (at 218) to the downstream process operation 115 for polishing. The processing tool 130 of the second process operation 115 processes (at 220) the incoming wafer in the manner prescribed. However, because the underlying wafer was misprocessed, it is assumed for the purposes of this illustration that the second process operation 115 produces a misprocessed wafer. The second FDC unit 140, based on the incoming defective wafer, detects (at 225) a fault with the second process operation 115. In this example, even though the processing tool 130 of the second process 115 operates as expected, it nevertheless produces a faulty wafer because of the defect in the original wafer. The FDC unit 140 provides (at 230) fault information based on at least a portion of the operational data associated with the second process operation 115 to the overall FDC unit 155. In one embodiment, the FDC unit 140 provides (at 230) information to the overall FDC unit 155 indicating that the fault was detected (at 225) with the second process operation 115. In yet another embodiment, the FDC unit 140 may provide (at 230) the entire operational data to the overall FDC unit 155.

The overall FDC unit 155, based on the operational data provided (at 225) by the FDC unit 140, determines (at 240) if the processing tool 130 of the second process operation 115 operated as expected when processing the incoming wafers. This may occur based on verifying one or more parameters of the processing tool 130. In the instant example, because the processing tool 130 is a polishing tool, the parameters such as polish time, downforce, polishing pad speed, motor current, polishing arm oscillation magnitude and frequency, slurry chemical composition, temperature may be verified. If it is determined (at 240) that the processing tool 130 operated as expected while processing the incoming wafers, the overall FDC unit 155 may indicate (at 250) that the fault is due to an upstream process operation (e.g., the first process operation 110, in this case), or, alternatively, the overall FDC unit 155 may perform fault detection analysis on the upstream process operation 110 to determine if it was the cause of the fault detected (at 225). If a fault is determined (at 250) with the first process operation 110, then the overall FDC unit 155 faults the first process operation 110 and allows the second process operation 115 to continue operating.

In some instances, the overall FDC unit 155 may fault any or all process operations 110, 115 that produce marginal results. Thus, for example, if the first process operation 110, as well as the second process operation 115, includes processing tools 125, 130 that become marginally "unhealthy," the overall FDC unit 155 may fault both of the processing tools 125, 130 and schedule a preventative maintenance event.

Figure 3:
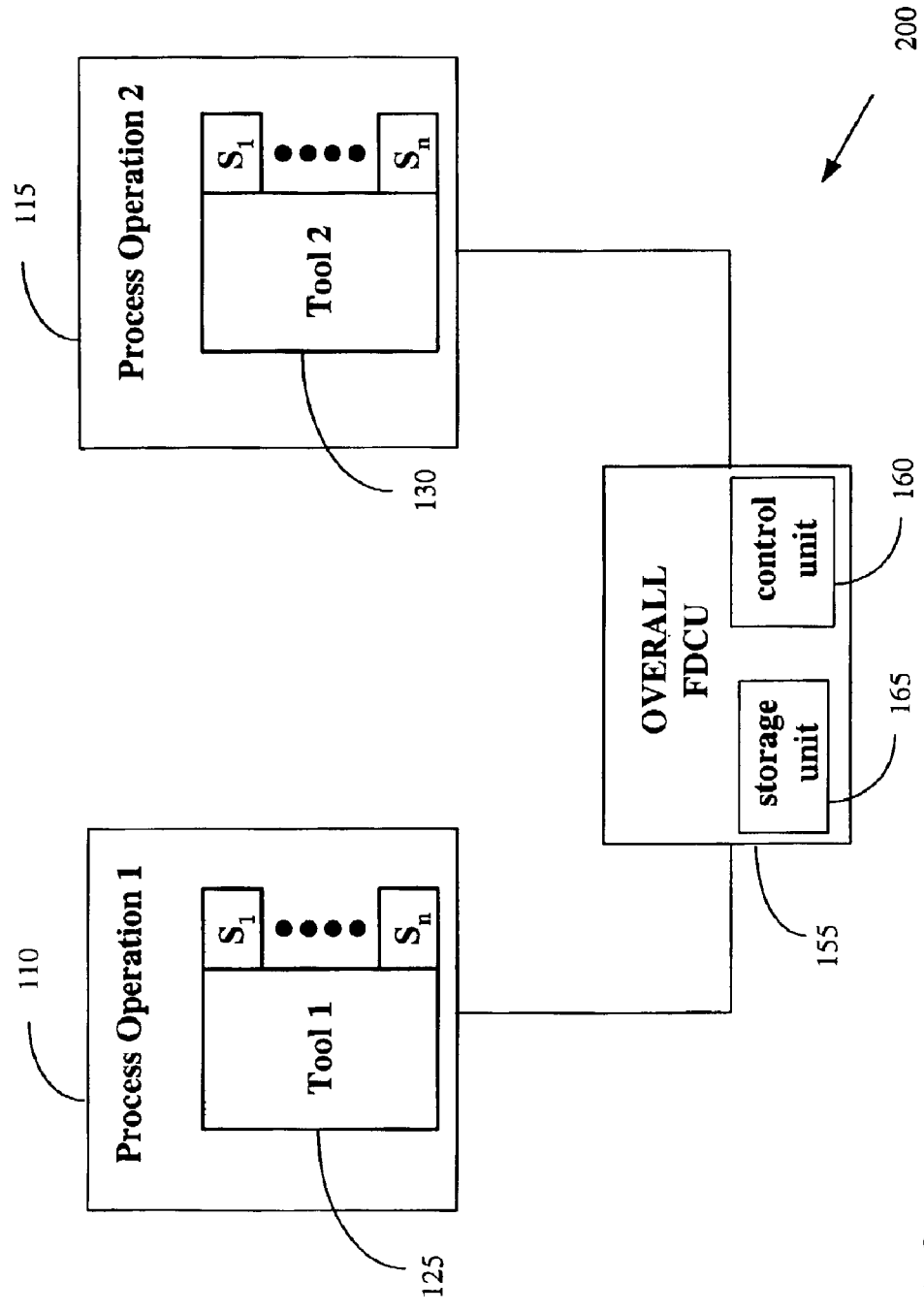
FIG. 3 illustrates an alternative embodiment of the manufacturing system of FIG. 1, in accordance with one embodiment of the present invention.

Although FIG. 1 illustrates the overall FDC unit 155 interfacing with the FDC units 135, 140 associated with the respective process operations 110, 115, in an alternate embodiment, the overall FDC unit 155 may interface directly with a plurality of process operations 110, 115, as shown in FIG. 3. In the illustrated example of FIG. 3, the processing tools 125, 130 of the process operations 110, 115 may provide operational data to the overall FDC unit 155 without intervening FDC units 135, 140. Because a common overall FDC unit 155 of FIG. 3 can monitor operational data across multiple process operations 110, 115, it can perform fault detection and classification based on the received data to identify the actual cause of the fault.

The various system layers, routines, or modules may be executable by the control units 147, 150, 160 (see FIG. 1). As utilized herein, the term "control unit" may include a microprocessor, a microcontroller, a digital signal processor, a processor card (including one or more microprocessors or controllers), or other control or computing devices. The storage units 165 (see FIG. 1) referred to in this discussion may include one or more machine-readable storage media for storing data and instructions. The storage media may include different forms of memory including semiconductor memory devices such as dynamic or static random access memories (DRAMs or SRAMs), erasable and programmable read-only memories (EPROMs), electrically erasable and programmable read-only memories (EEPROMs) and flash memories; magnetic disks such as fixed, floppy, removable disks; other magnetic media including tape; and optical media such as compact disks (CDs) or digital video disks (DVDs). Instructions that make up the various software layers, routines, or modules in the various systems may be stored in respective storage devices. The instructions when executed by a respective control unit cause the corresponding system to perform programmed acts.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   receiving operational data associated with a first process;
   receiving operational data associated with a second process, wherein the second process is downstream to the first process;
   performing fault detection analysis based on the operational data associated with the first process and second process using a fault detection unit;
   determining whether the second process performed as desired; and
   providing an indication of a fault associated with the first process in response to determining that a fault condition exists in the second process based on the operational data associated with the second process and in response to determining that the second process performed as desired.

2. The method of claims 1, wherein the first processing is a deposition process and the second process is a polishing process.

3. The method of claim 1, wherein determining whether the second process performed as desired comprises monitoring and analyzing one or more selected parameters associated with the second process.

4. The method of claim 1, wherein performing the fault detection analysis comprises performing the fault detection analysis based on the operational data associated with the first process and second process using a common fault detection unit.

5. The method of claim 4, wherein the first process has an associated first fault detection unit and the second process has an associated second fault detection unit, wherein performing the fault analysis using the common fault detection unit comprises receiving data from the first and second fault detection units and analyzing the received data.

6. The method of claim 1, wherein determining the fault comprises comparing the received operational data associated with a previously established fault model data.

7. A fault detection and classification unit, comprising:
an interface adapted to:
receive fault data from a first fault detection unit that is associated with a first processing tool;
receive fault data from a second fault detection unit that is associated with a second processing tool, wherein the second processing tool is downstream relative to the first processing tool; and
a control unit communicatively coupled to the interface, the control unit adapted to:
determine if a fault associated with the first processing tool occurred based on the fault data from the first fault detection unit and determine if a fault associated with the second processing tool occurred based on the fault data from the second fault detection unit; and
determine if the second processing tool is operating as desired in response to determining that a fault associated with the second processing tool occurred but no fault associated with the first processing tool occurred.

8. The apparatus of claim 7, wherein the control unit is further adapted to indicate a fault condition associated with the first processing tool in response to determining that the second processing tool is operating as desired.

9. The apparatus of claim 8, wherein the control unit determines if the second processing tool is operating as desired comprises the control unit verifying that selected parameters of the second processing tool are within an acceptable range.

10. The apparatus of claim 9, wherein the first processing tool is a deposition tool and the second processing tool is a polishing tool.

11. The apparatus of claim 10, wherein the selected parameters comprise at least one of air pressure, gas flow, down force, speed, resistivity, and power consumption.

12. The apparatus of claim 7, wherein each of the first and second processing tools perform a plurality of processing steps.

13. The apparatus of claim 12, wherein the fault data from the first and second fault detection units indicates whether a fault was detected in the respective first and second processing tools.

14. An article comprising one or more machine-readable storage media containing instructions that when executed enable a processor to:
receive operational data associated with a first process;
receive operational data associated with a second process, wherein the second process is downstream to the first process;
perform fault detection analysis based on the operational data associated with the first process and second process using a common fault detection unit.

15. The article of claim 14, wherein the instructions when executed enable the processor to determine if a fault condition exits in the second process based on the operational data associated with the second process.

16. The article of claim 15, wherein the instructions when executed enable the processor to determine whether the second process performed as desired.

17. The article of claim 16, wherein the instructions when executed enable the processor to provide an indication of a fault associated with the first process in response to determining that the fault condition exists in the second process and determining that the second process is performing as desired.

18. A system, comprising:
a first processing tool adapted to process a semiconductor device;
a second processing tool adapted to process the semiconductor device, wherein the second processing tool is downstream to the first processing tool; and
a fault detection and classification unit adapted to:
receive operational data from the first processing tool;
receive operational data from a second fault detection unit that is associated with a second processing tool, wherein the second processing tool is downstream relative to the first processing tool; and
determine if a fault associated with the first processing tool occurred based on the operational data from the first fault detection unit and determine if a fault associated with the second processing tool occurred based on the operational data from the second fault detection unit; and
determine if the second processing tool is operating as desired in response to determining that a fault associated with the second processing tool occurred but no fault associated with the first processing tool occurred.

19. The system of claim 18, wherein the fault detection and classification unit is further adapted to indicate a fault condition associated with the first processing tool in response to determining that the second processing tool is operating as desired.

20. The system of claim 19, wherein the fault detection and classification unit is adapted to determine if the second processing tool is operating as desired comprises verifying that selected parameters of the second processing tool are within acceptable range.

21. An apparatus, comprising:
means for receiving operational data associated with a first process;
means for receiving operational data accociated with a second process, wherein the second process is downstream to the first process;
means for performing fault detection analysis based on the operational data associated with the first process and second process using a fault detection unit;
means for determining whether the second process performed as desired; and
means for providing an indication of a fault associated with the first process in response to determining that a fault condition exists in the second process based on the operational data associated with the second process and in response to determining that the second process is performing as desired.

* * * * *